(12) United States Patent
Bijnen et al.

(10) Patent No.: US 11,105,619 B2
(45) Date of Patent: Aug. 31, 2021

(54) MEASUREMENT APPARATUS

(71) Applicant: ASML NETHERLANDS B.V., Veldhoven (NL)

(72) Inventors: Franciscus Godefridus Casper Bijnen, Valkenswaard (NL); Junichi Kanehara, Eindhoven (NL); Stefan Carolus Jacobus Antonius Keij, Breda (NL); Thomas Augustus Mattaar, Veldhoven (NL); Petrus Franciscus Van Gils, Rijen (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/629,990

(22) PCT Filed: Jul. 13, 2018

(86) PCT No.: PCT/IB2018/055196
§ 371 (c)(1),
(2) Date: Jan. 10, 2020

(87) PCT Pub. No.: WO2019/012495
PCT Pub. Date: Jan. 17, 2019

(65) Prior Publication Data
US 2020/0132447 A1    Apr. 30, 2020

(30) Foreign Application Priority Data

Jul. 14, 2017 (EP) .................................. 17181375
May 3, 2018 (EP) .................................. 18170698

(51) Int. Cl.
*G01B 11/27* (2006.01)

(52) U.S. Cl.
CPC .................................. *G01B 11/272* (2013.01)

(58) Field of Classification Search
CPC ........ H01J 37/16; H01J 37/285; H01J 37/222; G01N 23/2204; G03F 7/70733;
(Continued)

(56) References Cited

U.S. PATENT DOCUMENTS 5,448,332 A * 9/1995 Sakakibara ........... G03F 9/7026
355/53
6,697,145 B1    2/2004 Aoyama
(Continued)

FOREIGN PATENT DOCUMENTS

EP    1832933    9/2007
EP    2733732    5/2014
(Continued)

OTHER PUBLICATIONS

International Search Report and Written Opinion issued in corresponding PCT Patent Application No. PCT/IB2018/055196, dated Nov. 26, 2018.

*Primary Examiner* — Isiaka O Akanbi
(74) *Attorney, Agent, or Firm* — Pillsbury Winthrop Shaw Pittman LLP

(57) ABSTRACT

In order to improve the throughput performance and/or economy of a measurement apparatus, the present disclosure provides a metrology apparatus including: a first measuring apparatus; a second measuring apparatus; a first substrate stage configured to hold a first substrate and/or a second substrate; a second substrate stage configured to hold the first substrate and/or the second substrate; a first substrate handler configured to handle the first substrate and/or the second substrate; and a second substrate handler configured to handle the first substrate and/or the second substrate, wherein the first substrate is loaded from a first, second or third FOUP, wherein the second substrate is loaded from the first, second or third FOUP, wherein the first measuring apparatus is an alignment measuring apparatus, and wherein (Continued)

the second measuring apparatus is a level sensor, a film thickness measuring apparatus or a spectral reflectance measuring apparatus.

20 Claims, 8 Drawing Sheets

(58) Field of Classification Search
CPC ............... G03F 7/70866; G03F 7/7075; H01L 21/67092; G01B 11/272
USPC ........... 356/138, 399–401, 237.2–237.6, 124
See application file for complete search history.

(56) References Cited

U.S. PATENT DOCUMENTS

| | | | |
|---|---|---|---|
| 7,248,353 B2* | 7/2007 | Kimba | G06T 7/001 356/237.4 |
| 2001/0028456 A1* | 10/2001 | Nishi | G03F 7/70866 356/400 |
| 2005/0157280 A1 | 7/2005 | Novak | |
| 2005/0280798 A1* | 12/2005 | Kuit | G03F 7/7075 355/72 |
| 2006/0033921 A1 | 2/2006 | Den Boef et al. | |
| 2008/0291415 A1 | 11/2008 | Shibazaki | |
| 2009/0153824 A1 | 6/2009 | Balan | |
| 2009/0233234 A1 | 9/2009 | Shibazaki | |
| 2009/0251678 A1 | 10/2009 | Ohishi | |
| 2010/0157274 A1* | 6/2010 | Shibazaki | G03F 9/7003 355/72 |
| 2010/0296070 A1 | 11/2010 | Shibazaki | |
| 2010/0321679 A1 | 12/2010 | Brill et al. | |
| 2011/0242518 A1 | 10/2011 | Cadee et al. | |
| 2015/0122993 A1* | 5/2015 | Noji | H01J 37/05 250/307 |
| 2015/0287570 A1* | 10/2015 | Hayashi | H01J 37/185 250/310 |
| 2015/0378267 A1 | 12/2015 | Shibazaki | |
| 2016/0233118 A1* | 8/2016 | Kosuge | H01L 21/67092 |
| 2017/0235230 A1 | 8/2017 | Ebert et al. | |

FOREIGN PATENT DOCUMENTS

| | | |
|---|---|---|
| JP | S57115843 | 7/1982 |
| JP | 2005265655 | 9/2005 |
| JP | 2006060214 | 3/2006 |
| JP | 2006084333 | 3/2006 |
| JP | 2006135211 | 5/2006 |
| JP | 2007250578 | 9/2007 |
| JP | 2010025575 | 2/2010 |
| JP | 2010087310 | 4/2010 |
| JP | 2010283037 | 12/2010 |
| JP | 2012202980 | 10/2012 |
| JP | 2014204079 | 10/2014 |
| WO | 2012115013 | 8/2012 |
| WO | 2013100203 | 7/2013 |
| WO | 2014026819 | 2/2014 |

* cited by examiner

MEASUREMENT APPARATUS

This application is the U.S. national phase entry of PCT Patent Application No. PCT/IB2018/055196, filed on Jul. 13, 2018, which is based upon and claims the benefit of priority of European Patent Application No. 17181375.1 filed Jul. 14, 2017 and European Patent Application No. 18170698.7, filed May 3, 2018.

FIELD OF THE INVENTION

A first aspect of invention relates an alignment measuring apparatus, and a method to measure positions of alignment marks on a substrate.

A second aspect of the invention relates to a lithographic apparatus and a substrate stage handler system.

A third aspect of the invention relates to a metrology apparatus.

BACKGROUND ART

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In a known embodiment of a lithographic apparatus, the lithographic apparatus comprises an alignment measuring system to measure positions of alignment marks provided on the substrate. By measuring the positions of these alignment marks, a position and/or a deformation of the substrate with respect to a substrate table holding the substrate may be determined. This measured position and/or deformation of the substrate enables the lithographic apparatus to position the substrate in a desired position with respect to the projection system and/or the patterning device during the actual projection of a patterned radiation beam on a target portion of the substrate.

In this way, consecutive projections of a patterned radiation beam on a target portion of the substrate can be aligned with respect to each other. The overlay performance, i.e. the alignment of consecutive projections of a patterned radiation beam onto a target portion of the substrate is an important factor in product quality of a device manufactured using the lithographic apparatus.

There is a general need to improve the overlay performance of a lithographic apparatus to improve product quality. The overlay performance may for example be improved by measurement of substantially more alignment marks on the substrate. In particular, the substrate alignment grid may contain high frequency components of distortion that can be better corrected by measurement of a larger number of alignment marks. However, the measurement of a larger number of alignment marks will result in an increased alignment measurement time and will therefore have a limiting effect on the production performance of the lithographic apparatus.

Furthermore, during the manufacturing process of a device, the substrate is subject to multiple processing steps, such as layer deposition, etching, and annealing. The impact of these processing steps, which typically result in variation between substrates and/or between stacks of substrates and/or between layers of a substrate, on the overlay performance of the lithographic process is also significant.

Conventionally, there has been proposed an apparatus comprising a single substrate stage to measure (or inspect) one type of property of a substrate (for example, see Patent Documents 1 to 4). However, when such a conventional technique is adopted, in order to measure (and/or inspect) multiple properties of the same substrate, multiple apparatuses which respectively measure (and/or inspect) different types of properties are required.

CITATION LIST

Patent Document

Patent Document 1: Japanese Patent Application Publication No. 2007-250578

Patent Document 2: Japanese Patent Application Publication No. 2012-202980

Patent Document 3: Japanese Patent Application Publication No. 2006-135211

Patent Document 4: PCT Patent Application Publication WO 2012/115013

SUMMARY OF THE INVENTION

It is an object of the invention to provide an apparatus and/or a method to measure positions of multiple alignment marks on a substrate, that is capable of measuring a large number of alignment marks and/or that can better deal with the variation between substrates and/or between stacks of substrates and/or between layers of the substrate. It is a further object of the invention to provide a single unified metrology (inspection) apparatus comprising multiple substrate stages that is capable of measuring (inspecting) multiple types of properties of a substrate. In other words, an object of the invention is to improve the overall throughput performance and/or economy (which can be recognized from the viewpoint of, for example, cost of ownership, product price or installation area) of the metrology apparatus/the inspection apparatus.

According to an aspect of the invention, there is provided an alignment measuring apparatus to measure positions of alignment marks on a substrate, comprising:
  a first station, comprising:
    a first alignment sensor system to measure positions of a first number of alignment marks on the substrate, and
    a first level sensor to measure a height map of an upper surface of the substrate;
  a second station, comprising:
    a second alignment sensor system to measure positions of a second number of alignment marks on the substrate, and a second level sensor to measure a height map of an upper surface of the substrate; and a movable substrate table constructed to hold a substrate, wherein the substrate According to an aspect of the invention, there is provided a lithographic system comprising:

a lithographic apparatus comprising:

a support constructed to support a patterning device, the patterning device being capable of imparting the radiation beam with a pattern in its cross-section to form a patterned radiation beam, a substrate table constructed to hold a substrate, and a projection system configured to project the patterned radiation beam onto a target portion of the substrate;

an alignment measuring apparatus as described herein; and one or more substrate handlers to transfer substrates between a respective substrate table of the alignment measuring apparatus and a substrate table of the lithographic apparatus.

According to an aspect of the invention, there is provided a method to measure positions of alignment marks on a substrate, comprising:

in a first station, measuring positions of a first number of alignment marks on the substrate, and in a second station, measuring positions of a second number of alignment marks on the substrate, wherein the substrate is held by a same substrate table in the first station and the second station, and using the measured positions of the first number of alignment marks measured in the first station for measuring of the positions of the second number of alignment marks in the second station.

According to an aspect of the invention, there is provided a device manufacturing method comprising projecting a patterned radiation beam on a substrate, the method comprising:

in a first station of an alignment measuring apparatus, measuring positions of a first number of alignment marks on the substrate, and/or in a second station of the alignment measuring apparatus, measuring positions of a second number of alignment marks on the substrate, wherein a substrate table is holding the substrate in the first station and/or the second station, transferring the substrate, with one or more substrate handlers, from the substrate table of the alignment measuring apparatus to a substrate table of a lithographic apparatus, and projecting, in the lithographic apparatus, the patterned radiation beam on the substrate, using the measurements of the positions of the first number and/or second number of alignment marks According to an aspect of the invention, there is provided a lithographic apparatus, comprising:

a patterning device support to support a patterning device;

a first substrate table, a second substrate table and a third substrate table each constructed to support a substrate;

a first station, comprising:

an alignment sensor system to measure positions of a number of alignment marks on the substrate, and/or a level sensor to measure a height map of an upper surface of the substrate;

a second station, comprising:

an exposure unit to transfer a pattern from the patterning device to the substrate; and a substrate table positioning system to move each of the first substrate table, the second substrate table and the third substrate table in a planar area of movement between at least the first station and the second station, wherein a first cable connection is provided between the first substrate table and a first cable connection support, a second cable connection is provided between the second substrate table and a second cable connection support and a third cable connection is provided between the third substrate table and a third cable connection support, wherein at a first side of the planar area of movement a first linear guide is provided to guide the first cable connection support and the third cable connection support, and wherein at a second side of the planar area of movement, opposite to the first side, a second linear guide is provided to guide the second cable connection support.

According to an aspect of the invention, there is provided a metrology apparatus, comprising:

a first measuring apparatus;

a second measuring apparatus;

a first substrate stage configured to hold a first substrate and/or a second substrate;

a second substrate stage configured to hold the first substrate and/or the second substrate;

a first substrate handler configured to handle the first substrate and/or the second substrate; and a second substrate handler configured to handle the first substrate and/or the second substrate, wherein the first substrate is loaded from a first FOUP (Front-Opening Unified Pod), a second FOUP or a third FOUP, wherein the second substrate is loaded from the first FOUP, the second FOUP or the third FOUP, wherein the first measuring apparatus is an alignment measuring apparatus, and wherein the second measuring apparatus is a level sensor, a film thickness measuring apparatus or a spectral reflectance measuring apparatus.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
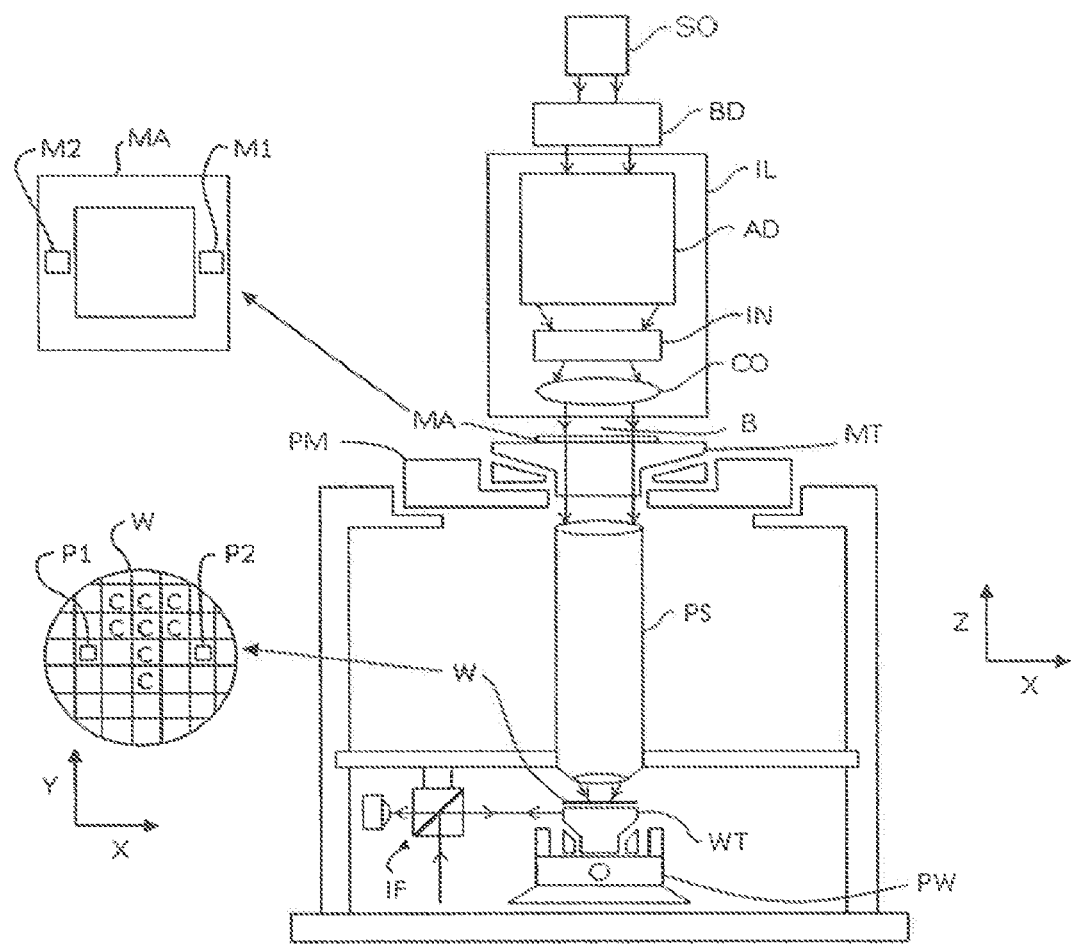
FIG. 1 depicts a lithographic apparatus according to an aspect of the invention.

FIG. 1 schematically depicts a lithographic apparatus that may be part of a lithographic system according to one embodiment of the invention. The lithographic apparatus comprises an illumination system IL, a support structure MT, a substrate table WT and a projection system PS.

The illumination system IL is configured to condition a radiation beam B. The support structure MT (e.g. a mask table) is constructed to support a patterning device MA (e.g. a mask) and connected to a first positioner PM configured to accurately position the patterning device in accordance with certain parameters. The substrate table WT (e.g. a wafer table) is constructed to hold a substrate W (e.g. a resist-coated wafer) and connected to a second positioner PW configured to accurately position the substrate in accordance with certain parameters. The projection system PS is configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The term "radiation beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The support structure MT supports, i.e. bears the weight of, the patterning device MA. The support structure MT holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS.

The term "patterning device" used herein should be broadly interpreted as referring to any device that can be used to impart a radiation beam B with a pattern in its cross-section such as to create a pattern in a target portion C of the substrate W. It should be noted that the pattern imparted to the radiation beam B may not exactly correspond to the desired pattern in the target portion C of the substrate W, for example if the pattern includes phase-shifting features or so called assist features. Generally, the pattern imparted to the radiation beam will correspond to a particular functional layer in a device being created in the target portion C, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam B in different directions. The tilted mirrors impart a pattern in a radiation beam B which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum.

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables WT (and/or two or more mask tables). In such "multiple stage" machines the additional tables may be used in parallel, or preparatory steps may be carried out on one or more tables while one or more other tables are being used for exposure. In addition to one or more substrate tables WT, the lithographic apparatus may have a measurement stage that is arranged to be at a position beneath the projection system PS when the substrate table WT is away from that position. Instead of supporting a substrate W, the measurement stage may be provided with sensors to measure properties of the lithographic apparatus. For example, the projection system may project an image on a sensor on the measurement stage to determine an image quality.

The lithographic apparatus may also be of a type wherein at least a portion of the substrate W may be covered by a liquid having a relatively high refractive index, e.g. water, so as to fill a space between the projection system and the substrate. An immersion liquid may also be applied to other spaces in the lithographic apparatus, for example, between the patterning device MA and the projection system PS. Immersion techniques are well known in the art for increasing the numerical aperture of projection systems. The term "immersion" as used herein does not mean that a structure, such as a substrate W, must be submerged in liquid, but rather only means that liquid is located between the projection system PS and the substrate W during exposure.

Referring to FIG. 1, the illumination system IL receives a radiation beam B from a radiation source SO. The radiation source SO and the lithographic apparatus may be separate entities, for example when the radiation source SO is an excimer laser. In such cases, the source is not considered to form part of the lithographic apparatus and the radiation beam B is passed from the radiation source SO to the illumination system IL with the aid of a beam delivery system BD comprising, for example, suitable directing mirrors and/or a beam expander. In other cases the radiation source SO may be an integral part of the lithographic apparatus, for example when the radiation source SO is a mercury lamp. The radiation source SO and the illuminator IL, together with the beam delivery system BD if required, may be referred to as a radiation system.

The illumination system IL may comprise an adjuster AD for adjusting the angular intensity distribution of the radiation beam B. Generally, at least the outer and/or inner radial extent (commonly referred to as σ-outer and σ-inner, respectively) of the intensity distribution in a pupil plane of the illumination system can be adjusted. In addition, the illumination system IL may comprise various other components, such as an integrator IN and a condenser CO. The illumination system IL may be used to condition the radiation beam B, to have a desired uniformity and intensity distribution in its cross-section.

The radiation beam B is incident on the patterning device MA, which is held on the support structure MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module and a short-stroke module, which form part of the first positioner PM. The long-stroke module may provide coarse positioning of the short-stroke module over a large range of movement. The short-stroke module may provide fine positioning of the support structure MT relative to the long-stroke module over a small range of movement. Similarly, movement of the substrate table WT may be realized using a long-stroke module and a short-stroke module, which form part of the second positioner PW. The long-stroke module may provide coarse positioning of the short-stroke module over a large range of movement. The short-stroke module may provide fine positioning of the substrate table WT relative to the long-stroke module over a small range of movement. In the case of a stepper (as opposed to a scanner) the support structure MT may be connected to a short-stroke actuator only, or may be fixed. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions C (these are known as scribe-lane alignment marks). Similarly, in situations in which more than one die is provided on the patterning device MA, the mask alignment marks M1, M2 may be located between the dies.

The depicted apparatus could be used in at least one of the following modes:

In a first mode, the so-called step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

In a second mode, the so-called scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In a third mode, the support structure MT is kept essentially stationary holding a programmable patterning device, and the substrate table WT is moved or scanned while a pattern imparted to the radiation beam B is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or similar types of the above described modes of use may be employed. Further, entirely different modes of use may also be employed.

As described above, the lithographic apparatus may comprise an alignment measuring system to measure positions of alignment marks provided on the substrate. By measuring the positions of these alignment marks P1, P2, a position of the substrate W with respect to the substrate table WT may be determined.

This measured position of the substrate W enables the lithographic apparatus to position the substrate W in a desired position with respect to the projection system PS and/or the patterning device M during the actual projection of a patterned radiation beam on a target portion of the substrate. In this way, consecutive projections of a patterned radiation beam on a target portion C of the substrate W can be aligned with respect to each other. The overlay performance, i.e. the alignment of consecutive projections of a patterned radiation beam on a target portion C of the substrate W, is an important factor in product quality of a device manufactured using the lithographic apparatus.

There is a general need to improve the overlay performance of a lithographic apparatus to improve product quality. The overlay performance may be improved, for example, by measurement of substantially more alignment marks on the substrate W. In particular, the substrate alignment grid may contain high frequency components of distortion that can be better corrected by measurement of a larger number of alignment marks. However, the measurement of a larger number of alignment marks will result in an increased alignment measurement time and therewith a limiting effect on the production performance of the lithographic apparatus.

Furthermore, during the manufacturing process of a device, the substrate is subject to multiple processing steps, such as layer deposition, etching, and annealing. The impact of these processing steps, which typically results in variation between substrates and/or between stacks of substrates and/or between layers of a substrate, on the overlay performance of the lithographic process is also significant.

The present disclosure is based on an insight that a substantial part of the alignment measurements can be made in a separate alignment measurement device. As a result, the production performance of the lithographic apparatus is less limited by an increased number of alignment measurements.

Figure 2:
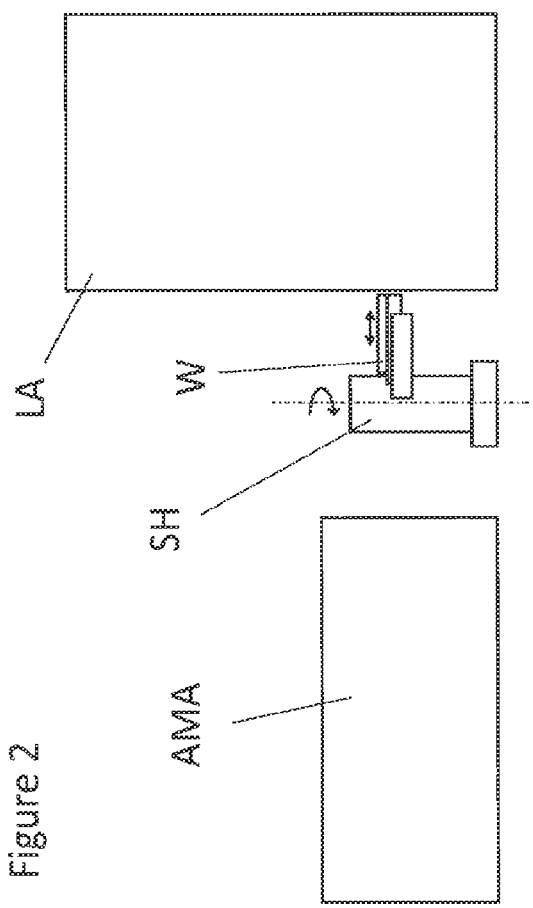
FIG. 2 shows schematically a lithographic system according to an embodiment of the invention.

FIG. 2 shows a lithographic system according to an embodiment of the invention. The lithographic system comprises a lithographic apparatus LA, an alignment measuring apparatus AMA and a substrate handler SH.

The lithographic apparatus LA may be the same or substantially the same as the lithographic apparatus shown in and described with respect to FIG. 1. The alignment measuring apparatus AMA is provided as a separate device that can be used to measure a large number of alignment marks without directly affecting the production performance of the lithographic apparatus LA.

The substrate handler SH is provided to transfer substrates W between the alignment measuring apparatus AMA and the lithographic apparatus LA. Further substrate handlers (not shown) may be provided to load substrates W into the alignment measuring apparatus AMA and to take substrates W out of the lithographic apparatus LA for further processing steps of the substrates W to manufacture a device.

The substrate handler SH may be any device capable of transferring a substrate W from the alignment measuring apparatus AMA to the lithographic apparatus LA. For example, the substrate handler SH may comprise a gripper that contacts the underside of the substrate, single or multiple robot arms, and/or a Bernoulli chuck that holds the substrate at the upper surface of the substrate. A Bernoulli chuck is described in PCT Patent Application Publication WO 2013/100203, which is incorporated herein in its entirety by reference.

When desired, multiple alignment measuring apparatuses AMA may be provided coupled via one or more substrate handlers SH to the lithographic apparatus LA. This makes the production performance of the lithographic apparatus even less dependent on the output of the alignment measuring apparatus AMA. Further, an apparatus comprising one or more alignment measuring apparatuses AMA and one or more substrate handlers SH may be referred to as a metrology apparatus.

Figure 3:
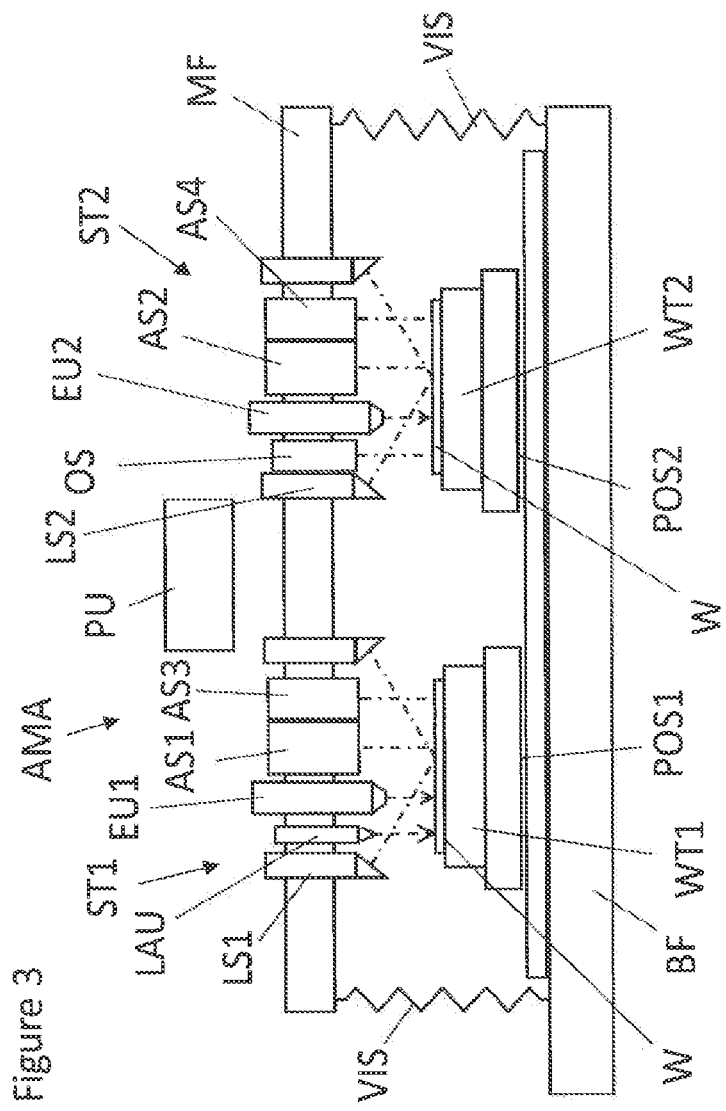
FIG. 3 shows schematically an alignment measuring apparatus according to an embodiment of the invention.

FIG. 3 shows an embodiment of an alignment measuring apparatus AMA in more detail. The alignment measuring apparatus AMA is arranged to measure multiple alignment marks provided on a substrate W. For example, the alignment measuring apparatus AMA includes a substrate alignment system comprising single or multiple FIA (Field Image Alignment) sensors. This substrate alignment system may be the same as or similar to the above-described alignment measuring system (to measure positions of alignment marks provided on the substrate in the lithographic apparatus). Further, the alignment measuring apparatus AMA may measure not only the positions of the alignment marks provided between the exposure fields (or between the dies) on the substrate, but also overlay marks provided in the exposure fields (or in the dies) on the substrate. The alignment measuring apparatus AMA may also measure the asymmetry of the alignment marks and/or the overlay marks in addition to measuring the positions of the alignment marks and/or the overlay marks provided on the substrate.

The alignment measuring apparatus AMA comprises a first substrate table (substrate stage) WT1 and a second substrate table (substrate stage) WT2. The first substrate table WT1 and the second substrate table WT2 are each configured to support a substrate W during processing of the substrate W in the alignment measuring apparatus AMA. Note that the substrates W supported by the first substrate table WT1 and the second substrate table WT2 can each be loaded from a first FOUP, a second FOUP or a third FOUP.

A first positioning system POS1 is provided to position the first substrate table WT1 in a desired position, and a second position system POS2 is provided to position the second substrate table WT2 in a desired position. The first positioning system POS1 and the second positioning system POS2 are supported on a base frame BF. The first positioning system POS1 and the second positioning system POS2, comprise an actuator system and a position measurement system to position the substrate W in six degrees of freedom in the desired position.

The alignment measuring apparatus AMA further comprises a metro frame MF which is supported on the base frame BF by vibration isolation supports VIS.

The alignment measuring apparatus AMA comprises a first station ST1 and a second station ST2 for processing a substrate W. The first substrate table WT1 and the second substrate table WT2 are movable between the first station ST1 and the second station ST2, such that a substrate W supported on one of the first substrate table WT1 and the second substrate table WT2, can be processed in the first station ST1 and/or the second station ST2. Thus, there is no transfer of a substrate W between the first substrate table WT1 and the second substrate table WT2 required to process a substrate W in the first station ST1 and subsequently in the second station ST2.

Substrate handlers (not shown in FIG. 3) may be provided to arrange a substrate W on the first substrate table WT1 and/or the second substrate table WT2, and/or to take a substrate W from the first substrate table WT1 and/or the second substrate table WT2.

In the first station ST1, a first alignment sensor AS1 and/or a first level sensor LS1 are provided. The second station ST2 comprises a second alignment sensor AS2 and/or a second level sensor LS2. The first alignment sensor AS1 comprises, for example, a single FIA (Field Image Alignment) sensor. Alternatively, the first alignment sensor AS1 may comprise multiple FIA sensors as disclosed in U.S. Patent Application Publication No. 2009/0233234 A1, which is incorporated herein in its entirety by reference. The second alignment sensor AS2 can be configured in the same way as the first alignment sensor AS1. Alternatively, the second alignment sensor AS2 may comprise an alignment sensor of a type different from that of the first alignment sensor AS1. A processing unit PU is provided to receive sensor signals of the first level sensor LS1, the first alignment sensor AS1, the second level sensor LS2 and/or the second alignment sensor AS2 and to process these sensor signals. The processing unit PU may also be arranged to control the first positioning system POS1 and the second positioning system POS2.

The structure of the first station ST1 and the second station ST2, with two or more substrate tables WT that can move between the two stations ST1, ST2 is very suitable to provide further devices or systems that can be used with respect to measuring the positions of alignment marks on the substrate W or to perform other measurements on the substrate W. In practice, the structure may be used as a basis to configure, as desired, the alignment measuring apparatus AMA to include the further devices or systems in dependence of the need of the user of the alignment measuring apparatus AMA. In a case where the alignment measuring apparatus AMA comprises multiple types of sensors, devices or systems, the alignment measuring apparatus AMA may be referred to as a metrology apparatus. Further, in a case where the alignment measuring apparatus AMA comprises one or more devices to inspect properties of a substrate, the alignment measuring apparatus AMA may be referred to as an inspection apparatus.

The further devices or systems may for example include, in the first station and/or the second station a first level sensor LS1, a second level sensor LS2, an first exposure unit EU1, a second exposure unit EU2, a laser ablation unit LAU and/or an overlay sensor OS. The further devices or systems may also include further alignment sensors, such as a third alignment sensor AS3 and a fourth alignment sensor AS4. An apparatus in which one or more exposure units are included in the further devices or systems can be referred to as the lithographic apparatus. Further, an apparatus in which the exposure unit is not included in the further devices or systems can be referred to as the metrology apparatus or the inspection apparatus. In other words, the essential difference between the lithographic apparatus and the metrology apparatus/the inspection apparatus is the presence or absence of the exposure unit, and the lithographic apparatus and the metrology apparatus/the inspection apparatus may comprise the same single or multiple alignment measuring apparatuses AMA, single or multiple substrate tables, and single or multiple substrate handlers.

Each of the further devices or systems may be connected to the processing unit PU, such that the processing unit PU may receive measurement data from the further devices or systems and/or that the processing unit PU may send instructions to the respective devices or systems.

FIG. 3 shows an embodiment of such configurable alignment measuring apparatus AMA.

The alignment measuring apparatus AMA comprises in the first station ST1 the first level sensor LS1 and in the second station ST2 the second level sensor LS2. The level sensors LS1, LS2 are provided to measure a height map of at least a part of an upper surface of the substrate W. Such height map can for example be used to more optimally position the substrate W with respect to other measuring devices, such as for example the second alignment sensor AS2, in the second station ST2. Further, in addition to or in place of the level sensor, the alignment measuring apparatus AMA may comprise a film thickness measuring apparatus and/or a spectral reflectance measuring apparatus. For example, the film thickness measuring apparatus may be provided in the first station ST1 and the spectral reflectance measuring apparatus may be provided in the second station ST2. Further, only the first alignment sensor AS1 may be provided in the first station ST1 and only the film thickness measuring apparatus/the spectral reflectance measuring apparatus may be provided in the second station ST2. When the alignment measuring apparatus AMA comprises one or more alignment sensors AS and the film thickness measuring apparatus/the spectral reflectance measuring apparatus, the alignment measuring apparatus AMA may be referred to as the metrology apparatus. The metrology apparatus may comprise one or more alignment sensors AS, one or more level sensors, one or more film thickness measuring apparatuses, and/or one or more spectral reflectance measuring apparatuses. The film thickness measuring apparatus may be, for example, a film thickness measuring apparatus capable of measuring a film thickness distribution of the entire surface of a substrate at high speed as disclosed in Japanese Patent Application Publication No. 2010-025575, which is incorporated herein in its entirety by reference. Instead of the spectral reflectance measuring apparatus, for example, a spectral reflectance prediction apparatus as disclosed in Japanese Patent Application Publication No. 2006-084333, which is incorporated herein in its entirety by reference, may be used. Further, as disclosed in Japanese Patent Application Publication No. 2005-265655, which is incorporated herein in its entirety by reference, the film thickness measuring apparatus may comprise the spectral reflectance measuring apparatus.

In dependence on the desired accuracy of the height map of the substrate W, one or more scans of the upper surface of the respective substrate W can be made. The upper surface can be completely scanned by the first level sensor LS1 to obtain a complete height map of the substrate W. In other embodiments the upper surface of the substrate W is only partly scanned at relevant parts of the substrate W. The height level may for example only be determined for small areas in which alignment marks are provided in order to optimize the vertical position and/or tilt position of the substrate W with respect to the second alignment sensor AS2 during measurement of the respective alignment mark with the second alignment sensor AS2. This optimized position of the alignment mark with respect to the second alignment sensor AS2 will improve the measurement performance of the second alignment sensor AS2.

Additionally or alternatively, the alignment measuring apparatus AMA may comprise in the first station ST1 a laser ablation unit LAU. This laser ablation unit LAU may be used to locally, in particular at the location of an alignment mark, cut out a part of a resist layer provided on the substrate W for the lithographic process. Some types of alignment sensors have decreased alignment measurement performance, when the measurement has to be carried out through the resist layer. Also, some types of resist layers used in the manufacture of devices are opaque. Opaque layers are for example often used in the manufacture of 3D cell stacking devices. These opaque layers prevent the alignment sensors AS1, AS2, AS3, AS4 to measure a position of an alignment mark through the opaque layer on top of the alignment mark.

By locally removing the resist layer with the laser ablation unit LAU, the alignment mark may be accessible to the alignment sensors AS1, AS2, AS3, AS4 without the measurement beam being required to travel through the resist layer of the substrate W. The laser ablation unit LAU thus provides the possibility to improve the measurement quality of the position measurements of the alignment mark, or to measure an alignment mark that is previously coated with an opaque layer.

Additionally or alternatively, in the first station ST1 and the second station ST2 a first exposure unit EU1 and a second exposure unit EU2 may be provided, respectively. The first exposure unit EU1 and the second exposure units EU2 can be used to project a further alignment mark on the substrate W. In some applications it is desirable to provide new alignment marks on a substrate W, for example since alignment marks tend to deteriorate during the lithographic process steps or since the alignment marks are covered by opaque layers and local cut out of the layer at the location of the alignment mark, for example using the laser ablation unit LAU is undesirable. An exposure unit EU1, EU2 may then be used to print the new alignment marks on the substrate W.

It is remarked that the first exposure unit EU1 and the first alignment sensor AS1 can simultaneously be used such that, while the exposure unit EU1 projects a new alignment mark on the substrate W, at least one existing alignment mark can be measured by the first alignment sensor AS1, such that the exact location of the new alignment mark with respect to the existing alignment mark can be determined. Similarly, the second exposure unit EU2 and the second alignment sensor AS2 can simultaneously be used in the second station ST2.

The first exposure unit EU1 and/or the second exposure unit EU2 may also be used to project a beam on a particular part of a resist layer in order to locally clear out this particular part of the resist layer. In particular the first exposure unit EU1 and/or the second exposure unit EU2 may be used to clear out a part of the resist layer provided on top of one or more alignment marks of the substrate W, corresponding to the use of the laser ablation unit LAU described hereinabove.

The first station ST1 also comprises a third alignment sensor AS3. The second station ST2 comprises a fourth alignment sensor AS4 and an overlay sensor OS. It is remarked that the third and fourth alignment sensor AS3, AS4 may be of a different type of alignment measuring apparatus than the first alignment sensor AS1 and the second alignment sensor AS2.

The provision of the third alignment sensor AS3 and the fourth alignment sensor AS4 provides even more flexibility with respect to the alignment measurements that can be carried out with the alignment measuring apparatus AMA. For example, in dependence on the outcome of previous alignment measurements and/or the knowledge of the specific substrate W to be measured, it may be determined which alignment sensor of the first and/or second station ST1, ST2 is most suitable to be used in the alignment measurements of alignment marks on a substrate W.

Also, the first alignment sensor AS1, the second alignment sensor AS2, the third alignment sensor AS3 and the fourth alignment sensor AS4 allow the measurement of different types of alignment marks on the same substrate W, which may also increase the quality of the alignment measurements of the substrate W. Further, these alignment sensors may measure not only positions of the alignment marks provided between exposure fields (or between dies) on the substrate, but also overlay marks provided in the exposure fields (or in the dies) on the substrate.

An overlay sensor OS is provided to measure overlay between projected patterns on the substrate W. The overlay sensor OS can for example be used to measure the overlay performance of the lithographic system. For example, the overlay sensor OS may measure the overlay marks on the substrate. Further, the above-described alignment sensor and/or the overlay sensor OS may measure the asymmetry of the alignment marks and/or the overlay marks. For the measurement of the asymmetry of these marks, for example, apparatuses/measuring methods as disclosed in Japanese Patent Application Publication No. 2006-060214 and PCT Patent Application Publication No. WO 2014/026819, which are incorporated herein in their entireties by reference, or an apparatus/a measuring method similar thereto may be used.

The alignment measuring apparatus AMA provides a large flexibility with respect to alignment measurements of the substrate W. This allows the user to adapt the alignment measurements on the specific properties, such as layer thickness, material properties and target shape, of the stack properties of substrates W to be processed. These stack properties are generally different per semiconductor device type, but these stack properties may also differ per substrate, and from substrate to substrate. Since a lithography apparatus may be used for different device types, the flexible alignment measuring apparatus AMA can be applied to deal efficiently with all these different stacks.

Furthermore, the alignment measuring apparatus AMA provides a first station ST1 and a second station ST2 in which two substrates can be simultaneously processed. This may substantially increase, for example double the measurement capacity, in a case where, for example, the first alignment sensor AS1 and the second alignment sensor AS2 are simply arranged in the respective stations and operated in the same manner. Further, in a case where different types of measuring apparatuses (or sensor systems) are arranged in the first station ST1 and the second station ST2, for example, in a case where the first alignment sensor AS1 and the film thickness measuring apparatus/the spectral reflectance measuring apparatus are arranged in the respective stations, not only two substrates can be simultaneously processed, but also the operation method of the alignment measuring apparatus AMA can be optimized in accordance with the difference in required measurement time. For example, if a time required for the first alignment sensor AS1 arranged in the first station ST1 to finish the alignment measurement of one substrate is three times longer than a time required for the film thickness measuring apparatus arranged in the second station ST2 to measure a film thickness distribution of the entire surface of a substrate (assuming that a time required for the substrate handler to exchange substrates can be ignored), about 3 substrates would be able to be processed at the second station ST2 while one substrate is processed at the first station ST1.

In an embodiment of a method using the alignment measuring apparatus, alignment measurement with respect to the position of the alignment marks on the substrate W may be performed in both the first station ST1 and the second station ST2, whereby the substrate W remains supported on one of the first substrate table WT1 and the second substrate table WT2.

Thereby, the results of an alignment measurement in the first station ST1 with the first alignment sensor AS1 may be used as an input for alignment measurements in the second station with the second alignment sensor AS2.

For example, in the first station ST1 the positions of a first number of alignment marks on the substrate may be measured by the first alignment sensor AS1. In the second station ST2, the positions of a second number of alignment marks on the substrate W may be measured by the second alignment sensor AS2, whereby the second number of alignment marks, i.e. quantity and/or location, are measured on the basis of the outcome of the alignment measurements in the first station ST1. The selection of the second number of alignment marks may for example be the result on the measurement quality determined with respect to the alignment measurements with the first alignment sensor AS1.

If it is likely on the basis of the measurements of the first alignment sensor AS1 that certain areas of the substrate W need further or relatively more alignment measurements to improve the measurement quality of the alignment marks on the substrate W, the second number of alignment marks may in particular be selected or concentrated in these areas to obtain a high number of position measurements of alignment marks in these areas.

In an embodiment, the number of alignment marks measured with the first alignment sensor AS1 (a first number) is substantially smaller than the number of alignment marks measured with the second alignment sensor AS2 (a second number). The measurement performed with the first alignment sensor AS1 will typically be used to optimize the measurement performed with the second alignment sensor AS2.

The number of alignment marks measured with the second alignment sensor AS2 (the second number) may be 200 or more per one substrate, and preferably may be 300 or more per one substrate. This relatively large number of measurements of alignment marks may substantially improve the measurement quality of the alignment marks, and therewith have a substantial positive effect on the overlay performance of the lithographic apparatus LA.

It is remarked that the first number of alignment marks and the second number of alignment marks may partially or completely overlap. That is, the alignment marks measured with the first alignment sensor AS1 and the alignment marks measured with the second alignment sensor AS2 may partially or completely overlap.

Hereinabove, an embodiment of the alignment measuring apparatus AMA as shown in FIG. 3 has been described. It will be clear for the person skilled in the art that many other configurations are also possible. For example, the laser ablation unit LAU, the first exposure unit EU1 and/or the third alignment sensor AS3 may be omitted in the first station ST1 and the second exposure unit EU2, the fourth alignment sensor AS4 and/or the overlay sensor OS may be omitted in the second station ST2. Correspondingly, an overlay sensor OS may be added in the first station ST1 and/or a laser ablation unit LAU may be added in the second station ST2. Also, in a case where the first alignment sensor AS1, the second alignment sensor AS2, the third alignment sensor AS3 and/or the fourth alignment sensor AS4 measure not only position of alignment marks on a substrate but also overlay marks on the substrate, the overlay sensor OS may be omitted.

Figure 4:
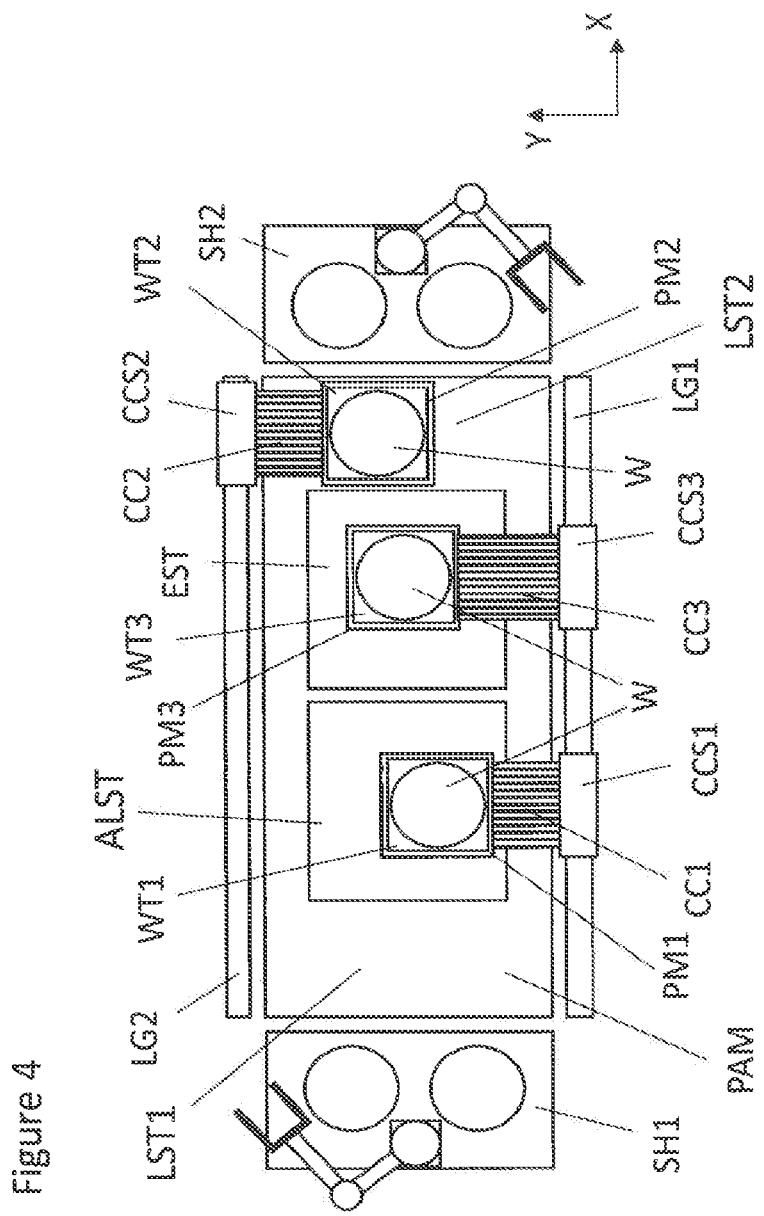
FIG. 4 shows a substrate stage handler system according to a first embodiment of an aspect of the invention.

FIG. 4 shows a first embodiment of a lithographic apparatus according to an aspect of the invention. In particular, FIG. 4 shows a top view of a substrate table configuration (substrate stage handler system) applied in a lithographic apparatus according to an embodiment of the invention. The substrate stage handler system according to the embodiment of the invention may be applied to a metrology apparatus or an inspection apparatus.

The substrate table configuration (substrate stage handler system) comprises a first substrate table WT1, a second substrate table WT2 and a third substrate table WT3 each constructed to support a substrate W. The first substrate table WT1, the second substrate table WT2 and the third substrate table WT3 are movably supported by a substrate table positioning system. The substrate table positioning system comprises a first positioning module PM1 which is movable in a planar area of movement PAM. Correspondingly, the second substrate table WT2 is supported by second positioning module PM2 that is movable within the planar area of movement PAM and the third substrate table WT3 is supported by a third positioning module PM3 that is also movable within the planar area of movement PAM.

The planar area of movement PAM may for example be defined by a planar surface formed by multiple arrays of permanent magnets. Each of the first positioning module PM1, the second positioning module PM2 and the third positioning module PM3 may comprise one or more actuation coils that, when energized by a controller, are capable of moving the respective positioning module PM1, PM2, PM3 with respect to the multiple arrays of permanent magnets to a desired position within the planar area of movement PAM. Each of the first positioning module PM1, the second positioning module PM2 and the third positioning module PM3 may comprise a fine positioning device to position the first substrate table WT1, the second substrate table WT2 and the third substrate table WT3 with high accuracy in a desired position, respectively.

A position measurement system may be provided to measure a position of the first substrate table WT1, the second substrate table WT2 and the third substrate table WT3 with high accuracy, preferably in six degrees of freedom. In an embodiment, the position measurement system comprises one or more grid plates arranged above at least a part of the planar area of movement PAM and encoder-type sensors mounted on each of the first substrate table WT1, the second substrate table WT2 and the third substrate table WT3 to determine a position of the respective substrate table WT1, WT2, WT3 with respect to the one or more grid plates. Alternatively, one or more grid plates may be provided on an upper surface, side surface and/or lower surface of each of the substrate tables WT1, WT2, WT3. In this case, multiple encoder-type sensors may be arranged on a metro frame MF, a base frame BF, and/or an arbitrary position around the operation area of each substrate table. Additionally or alternatively, the position measurement system may comprise an interferometer system. In this case, single or multiple mirrors may be provided on an upper surface, side surface and/or lower surface of each of the substrate tables.

The first substrate table WT1 is connected to the stationary part of the lithographic apparatus to supply some required supplies or signals to the first substrate table WT1. For example, there may be provided an electricity connection to provide energy, for example to energize the actuation coils, a vacuum conduit to facilitate a vacuum clamp, one or more cooling fluid conduits to provide cooling fluid and/or control connections to provide control signals to the first substrate table WT1. Also, there may be a need to transfer supplies or signals from the first substrate table WT1 to the stationary part of the lithographic apparatus, such as sensor signals or cooling fluid used to cool the first substrate table WT1.

In the above-described embodiment, these connections between the first substrate table WT1 and the stationary part of the lithographic apparatus, or at least part thereof, are provided in a first cable connection CC1. The first cable CC1 is provided between the first substrate table WT1 and a first cable connection support CCS1. The different connections in the first cable connection CC1 are provided as a row of connections which is relatively stiff in the x-direction and relatively flexible in other directions, in particular in the y-direction. Such a cable connection is also indicated as a cable schlepp. It is remarked that the term cable connection is used herein for any mechanical connection between the respective substrate table and other parts of the lithographic apparatus to transfer supplies, such as fluids, electric energy, air and/or signals between the respective substrate table and other parts of the lithographic apparatus.

Since the first cable connection CC1 is relatively stiff in the x-direction the first cable connection support CCS1 is movably supported on a first linear guide LG1 extending in the x-direction at a first side of the planar area of movement PAM. The first cable connection support CCS1 moves with respect to the first linear guide LG1 to follow movements of the first substrate table WT1 in the x-direction, such that the first cable connection CC1 does not have a large negative influence on the positioning of the first substrate table WT1. From the first cable connection support CCS1 further connections may be provided to other parts of the lithographic apparatus, for example to an energy source, a vacuum source, a cooling liquid source and/or a controller.

The first cable connection support CCS1 may be guided in any suitable way on the first linear guide LG1. For example, there may be a mechanical, fluid or gas bearing between the first cable connection support CCS1 and the first linear guide LG1. For example, an air bearing can be used. Preferably, the first linear guide LG1 is formed as a linear magnetic support guide.

The second substrate table WT2 is connected with a second cable connection CC2 to a second cable connection support CCS2. The second cable connection support CCS2 is movably guided on a second linear guide LG2. The second linear guide LG2 is arranged at a second side of the planar area of movement PAM opposite to the first side where the first linear guide LG1 extends along the planar area of movement PAM. The first linear guide LG1 and the second linear guide LG2 both extend in the same direction, e.g. in the embodiment of FIG. 4 the x-direction.

The third substrate table WT3 is connected with a third cable connection CC3 to a third cable connection support CCS3. The third cable connection support CCS3 is movably guided by the first linear guide LG1. As a result of the first cable connection support CCS1 and the third cable connection support CCS3 being both guided on the first linear guide LG1, the first substrate table WT1 and the third substrate table WT3 cannot swap position in the x-direction. In contrast, the second substrate table WT2 that is connected with the second cable connection CC2 to the second cable connection support CCS2 which is guided by the second linear guide LG2 may swap, in x-direction, positions with both the first substrate table WT1 and the third substrate table WT3. This means that the second substrate table WT2 can be positioned as shown in FIG. 4 at the right side of the third substrate table WT3, but also between the first substrate table WT1 and the third substrate table WT3 and at the left side of the first substrate table WT1.

To enable that a substrate W can be loaded on both the first substrate table WT1 and the third substrate table WT3, a first substrate handler SH1 is arranged at a third side of the planar area of movement PAM to load and/or unload a substrate W on the first substrate table WT1 and a second substrate handler SH2 is arranged at a fourth side of the planar area of movement PAM, opposite to the third side to load and/or unload a substrate W on the third substrate table WT3. Both the first substrate handler SH1 and the second substrate handler SH2 can be used to load and/or unload a substrate on the second substrate table WT2.

A first loading station LST1 is arranged adjacent to the first substrate handler SH1 and a second loading station LST2 is arranged adjacent to the second substrate handler SH2. The first substrate table WT1 and the second substrate table WT2 can be arranged in the first loading station LST1 when the first substrate handler SH1 loads or unloads a substrate W from the first substrate table WT1 or second substrate table WT2. Correspondingly, the second substrate table WT2 and the third substrate table WT3 can be arranged in the second loading station LST2 when the second substrate handler SH2 loads or unloads a substrate W on the second substrate table WT2 or the third substrate table WT3.

It is remarked that instead of the first substrate handler SH1 and the second substrate handler SH2, a single long arm substrate handler may be provided at one side of the planar area of movement PAM that can load and/or unload from this one side substrates W on each of the first substrate table WT1, the second substrate table WT2 and the third substrate table WT3.

The substrate table positioning system is configured such that the first substrate table WT1, the second substrate table WT2 and the third substrate table WT3 are at least movable between an alignment and level measuring station ALST and an exposure station EST.

Figure 5:
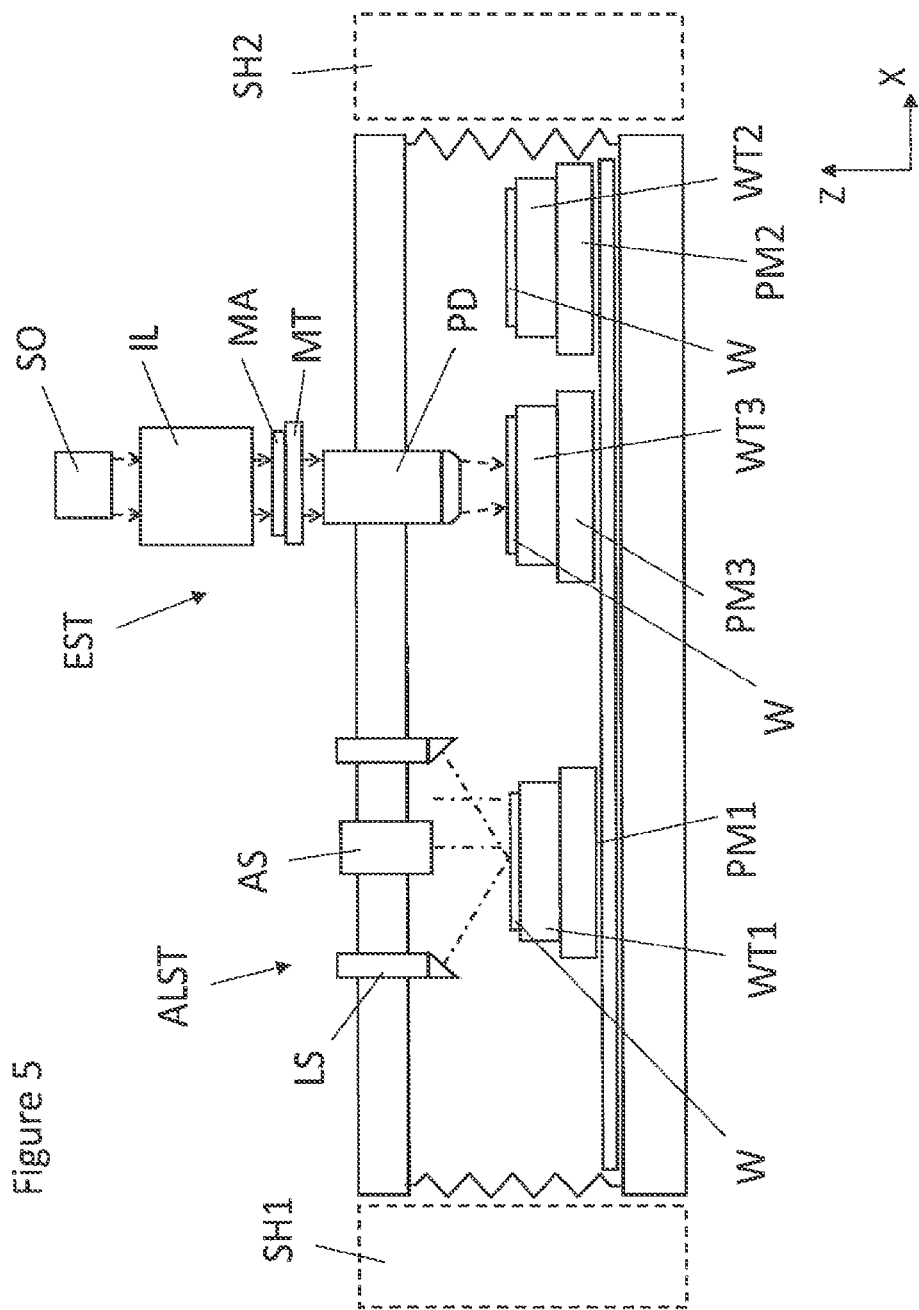
FIG. 5 shows a side view of a part of the lithographic apparatus.

FIG. 5 shows the alignment and level measuring station ALST and the exposure station EST in more detail. In the alignment and level measuring station ALST an alignment sensor AS is provided to measure positions of a number of alignment marks on the substrate, and a level sensor LS to measure a height map of an upper surface of the substrate W. In the exposure station EST an exposure unit is provided to transfer a pattern from a patterning device MA to the substrate W. The exposure unit comprises as described with respect to FIG. 1 a source SO, an illumination system IL, a patterning device support MT to support a patterning device and a projection system PS to project a patterned beam of radiation on a substrate W.

It is remarked that the alignment and level measuring station ALST may comprise multiple alignment sensors and/or level sensors, for example different types of alignment sensors that may be used as desired by the user of the lithographic apparatus.

The alignment and level measuring station ALST and the exposure station EST, are aligned with respect to each other, i.e. positioned next to each other in the x-direction. The direction of alignment of the alignment and level measuring station ALST and the exposure station EST is the same as the connection cable guide direction of the first linear guide LG1 and the second linear guide LG2.

An advantage of the substrate table configuration as shown in FIG. 4 is that the additional substrate table WT3 makes it possible to ensure a longer time for loading and/or unloading a substrate W on a substrate table WT1, WT2, WT3 and/or a longer time for alignment and/or level measurements in the alignment and level measuring station ALST.

By making the time for loading and unloading a substrate W longer, it is possible to reduce grid distortions and wear of the substrate table WT1, WT2, WT3 that is caused by fast wafer loading.

By making the alignment measurement time longer, it is possible to increase the number of alignment marks that may be measured in the alignment and level measuring station ALST. This results in that (inter-field and intra-field) grid densities of measured alignment marks on the substrate W can be increased furthermore. As a consequence, an overlay accuracy can be improved in the actual lithographic exposure process in the exposure station EST.

Figure 6:
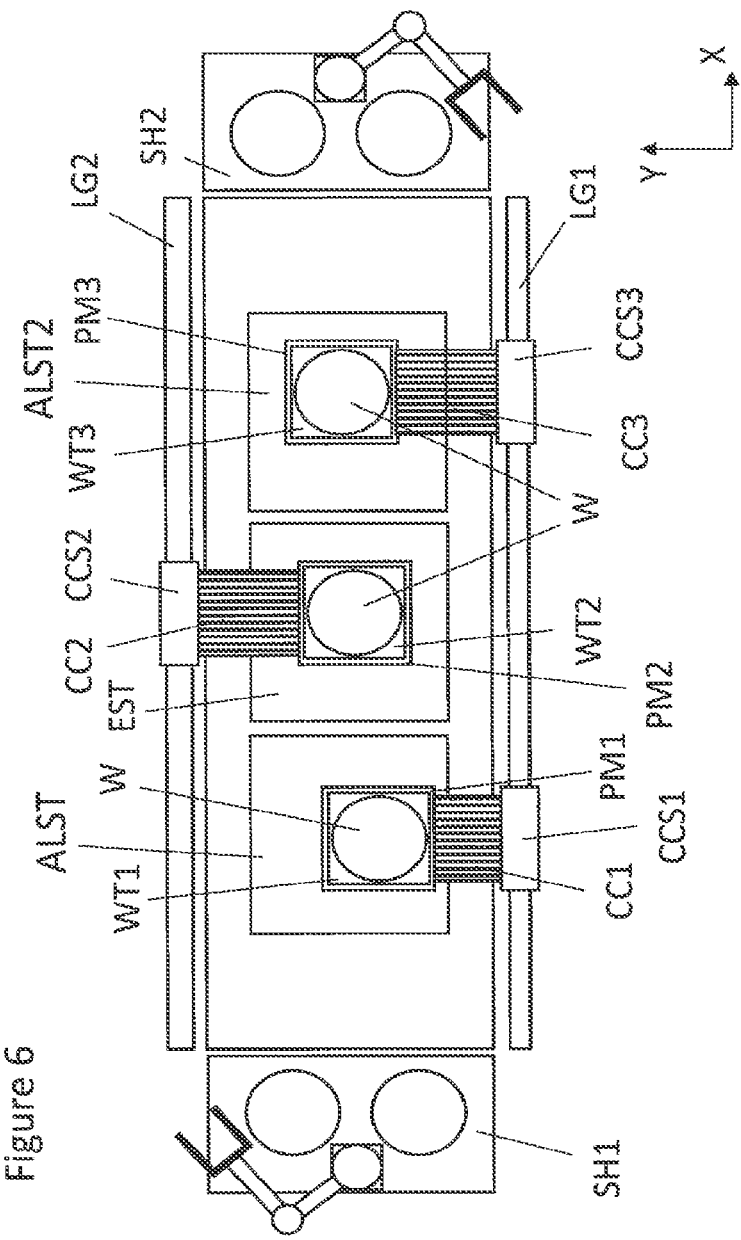
FIG. 6 shows a substrate stage handler system according to a second embodiment of an aspect of the invention.

FIG. 6 shows an another embodiment of a substrate stage handler system capable of being applied to a lithographic apparatus and a metrology apparatus, according to an embodiment of the invention. In the embodiment of FIG. 6, the lithographic apparatus comprises, in addition to the embodiment of FIG. 4, a second alignment and level measuring station ALST2. In the second alignment and level measuring station ALST2 an alignment sensor AS is provided to measure positions of a number of alignment marks on the substrate, and a level sensor LS to measure a height map of an upper surface of the substrate. The alignment sensor AS and the level sensor LS in the alignment and level measuring station ALST and the second alignment and level measuring station ALST2 may be substantially the same. The alignment and level measuring station ALST, the exposure station EST and the second alignment and level measuring station ALST2 are aligned in the x-direction, i.e. are arranged next to each other in the x-direction. In a case where this substrate stage handler system is applied to a metrology apparatus, a third alignment and level measuring station ALST3 may be arranged instead of the exposure station EST.

The alignment and level measuring station ALST and the second alignment and level measuring station ALST2 allow simultaneous measurement of alignment marks and/or the level measurement of the upper surface of two substrates W. For example, as shown in FIG. 6, the substrate W supported on the first substrate table WT1 is arranged in the alignment and level measuring station ALST and the substrate W supported on the third substrate table WT3 is arranged in the second alignment and level measuring station ALST2. At the same time, the substrate W supported on the second substrate table WT2 is processed in the exposure station EST. Typically, the first substrate table WT1 will be used in combination with the alignment and level measuring station ALST and the third substrate table WT3 be used in combination with the second alignment and level measuring station ALST2. The second substrate table WT2 may be used both in combination with the alignment and level measuring station ALST and in combination with the second alignment and level measuring station ALST2.

An advantage of the substrate table configuration as shown in FIG. 6 is that, by using the second alignment and level measuring station ALST2, a time for loading and/or unloading a substrate W on a substrate table WT1, WT2, WT3 and/or a time for alignment and level measurements in the alignment and level measuring station ALST can be prolonged further.

Figure 7:
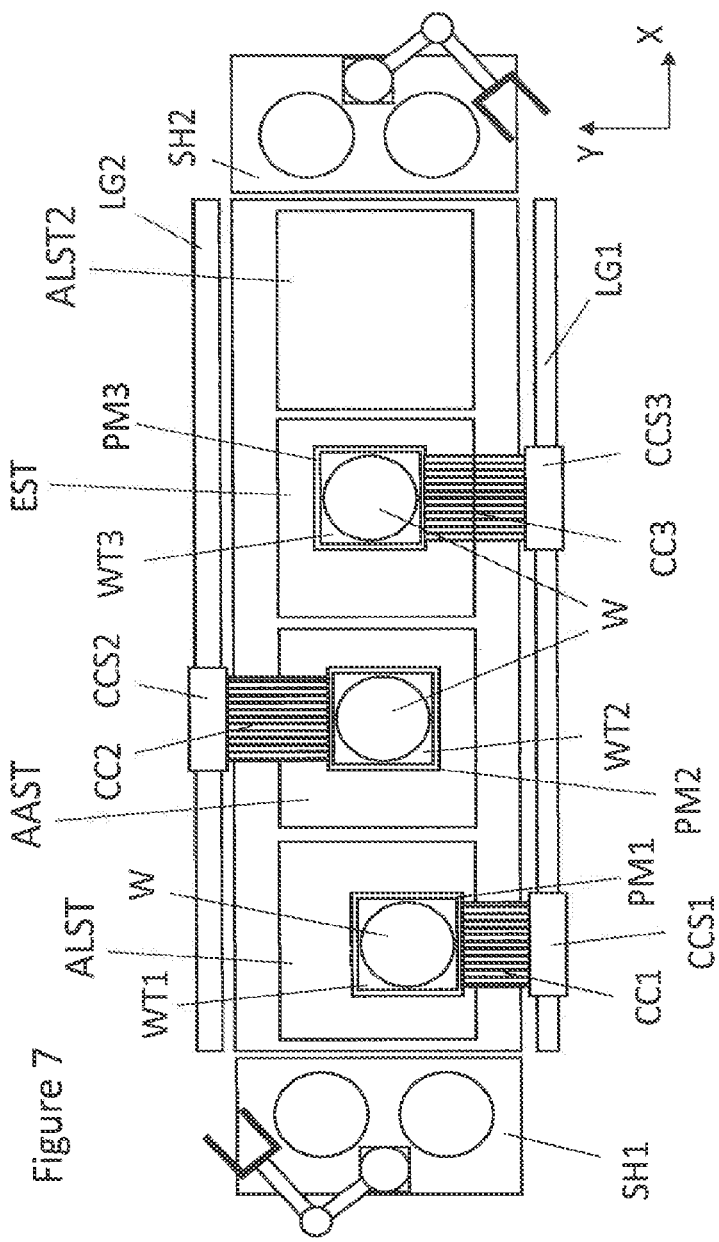
FIG. 7 shows a substrate stage handler system according to a third embodiment of an aspect of the invention.

FIG. 7 shows another embodiment of a substrate stage handler system capable of being applied to a lithographic apparatus and a metrology apparatus, according to an embodiment of the invention. In the embodiment of FIG. 7, the lithographic apparatus comprises, in addition to the embodiment of FIG. 6, an additional alignment measuring station AAST comprising an alignment sensor system to measure positions of a number of alignment marks on a substrate W supported by one of the first substrate table WT1, the second substrate table WT2 or the third substrate table WT3. The type of alignment sensor provided and used in the additional alignment measuring station AAST may be different than the alignment sensors AS of the alignment and level measuring station ALST and the second alignment and level measuring station ALST2. In an alternative embodiment, the type of alignment sensor in the additional alignment measuring station AAST may be the same as the alignment sensors AS of the alignment and level measuring station ALST and the second alignment and level measuring station ALST2. Also, a combination of the same and different alignment sensors may be provided in the additional alignment measuring station AAST.

The alignment and level measuring station ALST, the second alignment and level measuring station ALST2 and the additional alignment measuring station AAST may be used as described hereinabove with respect to the alignment measuring apparatus AMA, shown in FIG. 3. The alignment and level measuring station ALST and the second alignment and level measuring station ALST2 may be configured as the first station of the alignment measuring apparatus AMA, while the additional alignment measuring station AAST may be configured as the second station of the alignment measuring apparatus AMA, with the difference that the alignment and level measuring station ALST, the second alignment and level measuring station ALST2 and the additional alignment measuring station AAST are arranged in the lithographic apparatus instead of in a separate alignment measuring apparatus AMA. Any other configuration of the alignment and level measuring station ALST, the second alignment and level measuring station ALST2 and the additional alignment measuring station AAST may also be applied.

Figure 8:
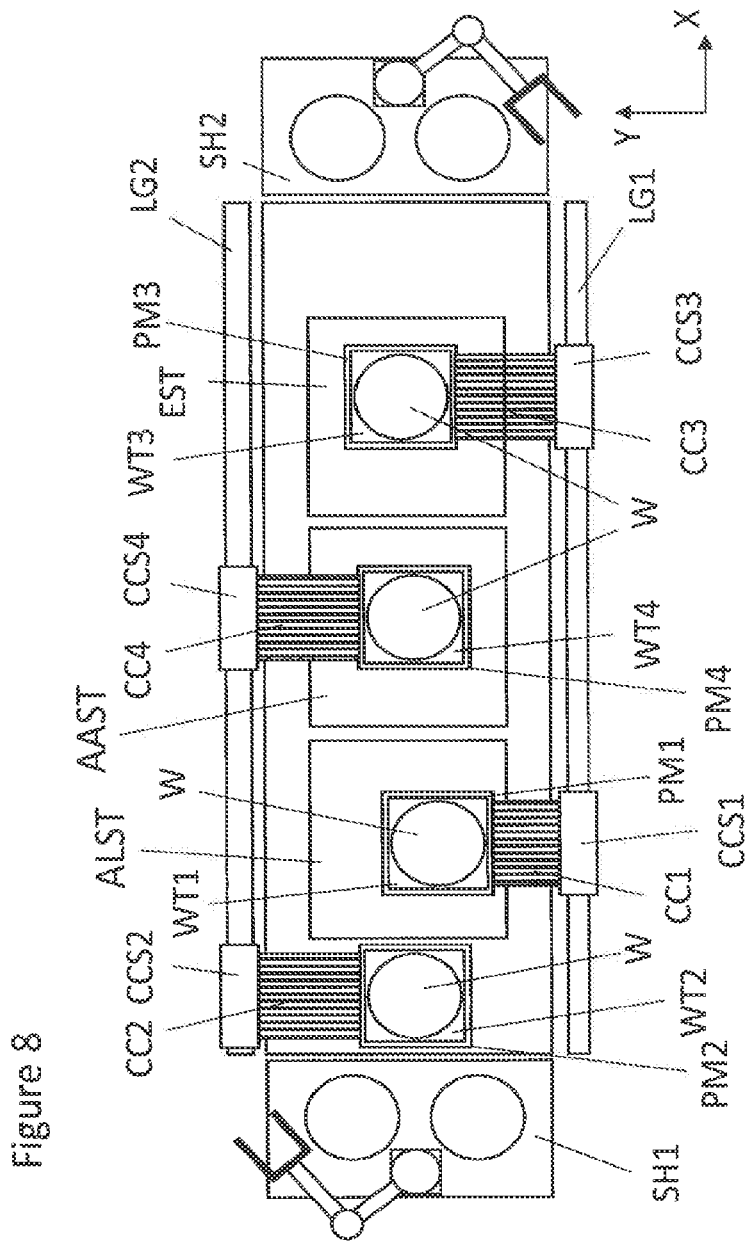
FIG. 8 shows a substrate stage handler system according to a fourth embodiment of an aspect of the invention.

FIG. 8 shows another embodiment of a substrate stage handler system capable of being applied to a lithographic apparatus and a metrology apparatus, according to an aspect of the invention. In the embodiment of FIG. 8, a fourth substrate table WT4 constructed to support a substrate W. The fourth substrate table WT4 is supported on a fourth positioning module PM4 which is movable in the planar area of movement PAM.

A fourth cable connection CC4 is provided between the fourth substrate table WT4 and a fourth cable connection support CCS4. The fourth cable connection support CCS4 is supported on the second linear guide LG2. The first substrate handler SH1 is provided to load and unload substrates W on the first substrate table WT1 and the second substrate table WT2. The second substrate handler SH2 is provided to load and unload substrates W on the third substrate table WT3 and the fourth substrate table WT4. Since the second cable connection support CCS2 and the fourth cable connection support CCS4 are both guided by the second linear guide LG2, it is clear that the second substrate table WT2 and the fourth substrate table WT4 cannot swap position in x-direction. However, the second substrate table WT2 and the fourth substrate table WT4 can be arranged in any position, in x-direction, with respect to the first substrate table WT1 and the third substrate table WT3.

In the planar area of movement PAM of the substrate tables WT1, WT2, WT3, WT4, an alignment and level measuring station ALST, an additional alignment measuring station AAST and an exposure station EST are arranged. The alignment and level measuring station ALST, the additional alignment measuring station AAST and the exposure station EST are aligned in the x-direction, in particular parallel to the cable connection guide direction of the first linear guide LG1 and the second linear guide LG2. The alignment and level measuring station ALST may be configured as the first station of the alignment measuring apparatus AMA, while the additional alignment measuring station AAST may be configured as the second station of the alignment measuring apparatus AMA. Any other configuration of the alignment and level measuring station ALST and the additional alignment measuring station AAST may also be applied. In a case where this substrate stage handler system is applied to a metrology apparatus, a third alignment and level measuring station ALST3 may be arranged instead of the exposure station EST.

As a result of the provision of four substrate tables WT1, WT2, WT3, WT4, a time for loading/unloading a substrate W and a time for carrying out alignment and level measurements are prolonged further.

Also, in all embodiments of FIGS. 4-8, the substrate W remains on the same substrate table WT1, WT2, WT3, WT4 during level measurements, alignment measurements and exposure of a patterned beam of radiation on the substrate W.

It is remarked that between two cable connection supports which are guided on a single linear guide, a further cable connection support may be provided to support a cable connection to a further positioning module. The further positioning module may not be configured to support a substrate table, since it cannot be arranged next to a substrate handler SH1, SH2, but it may for example be configured to carry out metrology and/or calibration processes.

However, in an embodiment, the further positioning module may also comprise a substrate table constructed to support a substrate W. In that case, at least one substrate handler should be provided that is capable of loading and unloading a substrate on the substrate table of the further positioning module. Such substrate loader may for example be a long arm substrate handler that can load a substrate at a relatively long distance from the base of the substrate handler, e.g. over the first substrate table to the substrate table of the further positioning module.

Hereinabove, with respect to FIGS. 4-8, different combinations of three or more substrate tables with multiple process stations comprising an exposure station and/or an alignment and level measuring station, are described. Further stations such as an alignment and level measuring station may be provided to increase time available for loading/unloading a substrate on a respective substrate table and for carrying out alignment and level measurements. That is, by applying the above-described substrate stage handler system to a lithographic apparatus, it is possible to improve the overlay performance of the lithographic process. It will be clear that also other substrate table configurations may be provided.

An importance advantage of the embodiments of FIGS. 4-8 in a case where the above-described substrate stage handler system is applied to a lithographic apparatus is that the substrate W remains supported on a respective substrate table WT1, WT2, WT3, WT4 during alignment and level measurements and subsequent exposure of a patterned radiation beam. Further, an advantage in a case where the above-described substrate stage handler system is applied to a metrology apparatus (or an inspection apparatus) is that the number (or type) of a measuring device/an inspection device, the number of a substrate table, and the number of a substrate handler need not be the same, and by optimizing the combination of these numbers, it is possible to efficiently measure (inspect) multiple types of properties of a substrate. In a case where a metrology apparatus includes different types of measuring devices (inspection devices, sensor systems), for example an alignment sensor and a level sensor (or a film thickness measuring apparatus/a spectral reflectance measuring apparatus), by considering the difference in time required for each measuring device to finish the measurement of one substrate, it is furthermore possible to optimize the number of a measuring device/an inspection device, the number of a substrate table, the number of a substrate handler, and an operation method of the metrology apparatus. In other words, by providing a single unified metrology (inspection) apparatus capable of measuring (inspecting) multiple types of properties of a substrate, and optimizing the number of a measuring device/an inspection device, the number of a substrate table, the number of a substrate handler of such a metrology apparatus, and an operation method of the metrology apparatus, it is possible to improve the throughput performance and/or economy of the metrology apparatus/the inspection apparatus as compared with a case of using multiple metrology apparatuses/inspection apparatuses.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the invention have been described above, it will be appreciated that the invention may be practiced otherwise than as described. For example, an embodiment of the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A metrology apparatus for measuring a first substrate and a second substrate prior to them being sent to a separate lithographic apparatus for exposure, based on the measurements made by the metrology apparatus, of the first and second substrates, the metrology apparatus comprising:
   a first measuring apparatus;
   a second measuring apparatus;
   a first substrate stage configured to hold the first substrate or the second substrate;
   a second substrate stage configured to hold the other of the first substrate or the second substrate; and
   a substrate handler configured to handle the first substrate and/or the second substrate,
   wherein the first measuring apparatus is a first alignment sensor system to measure positions of a first number of alignment marks on a substrate supported by the first substrate stage and/or the second substrate stage,
   wherein the second measuring apparatus is a level sensor configured to make height measurements, a film thickness measuring apparatus or a spectral reflectance measuring apparatus, and
   wherein the first substrate stage and/or the second substrate stage is movable from measurement of a substrate by the first measuring apparatus to measurement of the substrate by the second measurement apparatus or vice versa.

2. The metrology apparatus of claim 1, comprising a substrate stage positioning system to move each of the first substrate stage and the second substrate stage in a planar area of movement,
   wherein a first cable connection is provided between the first substrate stage and a first cable connection support, and a second cable connection is provided between the second substrate stage and a second cable connection support,
   wherein at a first side of the planar area of movement a first linear guide is provided to guide the first cable connection support, and
   wherein at a second side of the planar area of movement, opposite to the first side, a second linear guide is provided to guide the second cable connection support.

3. The metrology apparatus of claim 2, wherein the first linear guide and the second linear guide extend in the same connection cable guide direction.

4. The metrology apparatus of claim 2, wherein the first linear guide and the second linear guide are linear magnetic support guides.

5. The metrology apparatus of claim 2, wherein each of the first substrate stage and the second substrate stage is supported by a positioning module that is movable over a planar positioning surface defining the planar area of movement.

6. The metrology apparatus of claim 2, wherein at a third side of the planar area of movement, the first substrate handler is provided to load and/or unload a substrate on the first substrate stage, and
wherein at a fourth side, opposite to the third side, of the planar area of movement, the substrate handler is provided to load and/or unload a substrate on the second substrate stage.

7. The metrology apparatus of claim 6, comprising:
a first loading station adjacent to a first part of the first substrate handler; and
a second loading station adjacent to a second part of the substrate handler.

8. The metrology apparatus of claim 2, wherein at a third side of the planar area of movement, a long arm substrate handler is provided to load and/or unload a substrate on the first and/or second substrate stage.

9. The metrology apparatus of claim 1, comprising a position measurement system to determine a position of the first and second substrate stages.

10. The metrology apparatus of claim 1, comprising:
a first station; and
a second station,
wherein the first substrate stage and/or the second substrate stage are arranged to move to the first station and the second station.

11. The metrology apparatus of claim 10, wherein the first station and/or the second station comprises an overlay sensor to measure overlay between projected patterns on a substrate.

12. The metrology apparatus of claim 10, wherein a third station is arranged next to the second station at a side opposite to the side where the first station is arranged.

13. The metrology apparatus of claim 12, wherein a structure of the first station, the second station and/or the third station is designed to selectively add an alignment measuring apparatus, a level sensor, a film thickness measuring apparatus, a spectral reflectance measuring apparatus, a laser ablation unit and/or an overlay sensor.

14. The metrology apparatus of claim 10, wherein the second station comprises a second alignment sensor system to measure positions of a second number of alignment marks on a substrate supported by the first substrate stage and/or the second substrate stage.

15. The metrology apparatus of claim 14, wherein the first number of alignment marks is substantially smaller than the second number of alignment marks.

16. An alignment measuring apparatus to measure positions of alignment marks on a substrate, the apparatus comprising:
a first station, comprising:
a first alignment sensor system to measure positions of a first number of alignment marks on a substrate, and
a first level sensor to measure a height map of an upper surface of the substrate;
a second station, comprising:
a second alignment sensor system to measure positions of a second number of alignment marks on a substrate, and
a second level sensor to measure a height map of an upper surface of the substrate; and
a movable substrate table constructed to hold a substrate, wherein the substrate table is arranged to move to the first station and the second station.

17. The alignment measuring apparatus of claim 16, wherein the first and/or second station further comprises a film thickness measuring apparatus, a spectral reflectance measuring apparatus, a laser ablation unit and/or an overlay sensor.

18. The alignment measuring apparatus of claim 16, wherein a structure of the first and/or second station is designed to selectively add the film thickness measuring apparatus, the spectral reflectance measuring apparatus, the laser ablation unit and/or the overlay sensor to respectively the first and/or second station.

19. The alignment measuring apparatus of claim 16, wherein the first number of alignment marks is substantially smaller than the second number of alignment marks.

20. A method to measure positions of alignment marks on a substrate, the method comprising:
in a first station, measuring positions of a first number of alignment marks on the substrate,
in a second station, measuring positions of a second number of alignment marks on the substrate, wherein the substrate is held by a same substrate table in the first station and the second station, and
using the measured positions of the first number of alignment marks measured in the first station for measuring of the positions of the second number of alignment marks in the second station.

* * * * *